United States Patent [19]

Ishikawa et al.

[11] Patent Number: 5,240,556
[45] Date of Patent: Aug. 31, 1993

[54] SURFACE-HEATING APPARATUS AND SURFACE-TREATING METHOD

[75] Inventors: Yoshio Ishikawa; Junichi Arami, both of Tokyo; Towl Ikeda, Kofu; Teruo Iwata, Nirasaki, all of Japan

[73] Assignee: Tokyo Electron Limited, Tokyo, Japan

[21] Appl. No.: 893,018

[22] Filed: Jun. 3, 1992

[30] Foreign Application Priority Data

Jun. 5, 1991 [JP] Japan .................. 3-161024
Jun. 7, 1991 [JP] Japan .................. 3-136121

[51] Int. Cl.⁵ .................. H01L 21/306; B44C 1/22
[52] U.S. Cl. .................. 156/643; 156/345
[58] Field of Search .............. 156/643, 646, 657, 662, 156/345; 204/192.32, 192.37, 298.35, 298.37, 298.38; 118/724, 725; 219/121.4, 121.41; 437/247, 248

[56] References Cited

U.S. PATENT DOCUMENTS

| | | |
|---|---|---|
| 4,838,978 | 6/1989 | Sekine et al. .................. 156/345 |
| 4,878,995 | 11/1989 | Arikado et al. .................. 156/643 |
| 5,078,851 | 1/1992 | Nishihata et al. .............. 204/298.34 |
| 5,085,750 | 2/1992 | Soraoka et al. ................. 204/192.32 |

FOREIGN PATENT DOCUMENTS 1241126 9/1989 Japan .

Primary Examiner—William A. Powell
Attorney, Agent, or Firm—Oblon, Spivak, McClelland, Maier & Neustadt

[57] ABSTRACT

According to this invention, a surface-treating apparatus capable of etching an object to be treated with high accuracy, suppressing discharging of a harmful gas deposited on the etched object in the air, and preventing the surface of the object from deposition/attachment of reaction products and droplets is disclosed. The surface-treating apparatus includes a first process chamber for etching a loaded object to be treated by an activated etching gas, an exhausting member for setting the first process chamber at a low pressure, a cooling means for cooling the object loaded in the first process chamber, a second process chamber in which the object etched by the first process chamber is loaded, an exhausting member for setting the second process chamber at a low pressure, and an heating member for annealing the object loaded in the second process chamber.

27 Claims, 8 Drawing Sheets

SURFACE-HEATING APPARATUS AND SURFACE-TREATING METHOD

BACKGROUND OF THE INVENTION

1. Field of the Invention

The present invention relates to a surface-treating apparatus and a surface-treating method and, more particularly, to a surface-treating apparatus and a surface-treating method for improving discharging of various gases deposited on the surface of an object to be treated, e.g., a semiconductor wafer.

2. Description of the Related Art

A surface-treating apparatus, e.g., an etching apparatus, is used in a step of forming a fine circuit pattern of a semiconductor device.

As a conventional etching apparatus, an etching apparatus having the following structure is known. A process chamber (etching process chamber) includes a gas exhaust pipe and an etching gas supply pipe. An upper electrode and a lower electrode are arranged in the etching process chamber to be opposite to each other. An RF power supply is connected to, e.g., the lower electrode. A load lock chamber having a convey mechanism is connected to the etching process chamber. A gas exhaust pipe and an inert gas supply pipe are connected to the load lock chamber. A gate valve is inserted to the connection portion between the etching process chamber and the load lock chamber. The load lock chamber is used to load an object to be treated, e.g., a semiconductor wafer, in the etching process chamber set in a low-pressure atmosphere or unload the etched wafer unloaded from the etching process chamber after the wafer is set in an atmospheric pressure.

In order to etch a semiconductor wafer using the above etching apparatus, after the semiconductor wafer is loaded in the load lock chamber, gases in the load lock chamber and the etching process chamber are exhausted through the gas exhaust pipes, respectively, to obtain a desired low-pressure atmosphere. Subsequently, the gate valve is opened, and the semiconductor wafer in the load lock chamber is conveyed on the lower electrode in the etching process chamber by the convey mechanism. The gate valve is closed, and while the gas is continuously exhausted, an etching gas is supplied from the etching gas supply pipe to the etching process chamber. When the low-pressure state of the etching process chamber is stabled, an RF power is supplied from the RF power supply to the lower electrode. At this time, a plasma is generated between the upper electrode and the lower electrode, and the etching gas supplied to the etching process chamber is activated. The activated etching gas and ions act on the semiconductor wafer placed on the lower electrode to perform etching.

A more fine circuit pattern has been demanded according to an increase in integration density of a semiconductor device. In response to this demand, the following technique is developed. When a semiconductor wafer is etched using the above etching apparatus, the etching is performed while the semiconductor wafer is cooled at minus several tens of ° C.

However, the above conventional technique has the following problems.

That is, since the semiconductor wafer is arranged in the etching process chamber set in a low-pressure atmosphere and is etched while it is cooled, an etching gas (e.g., chlorine-based gas) is deposited on the surface of the semiconductor wafer. After the etched semiconductor wafer is conveyed in the load lock chamber and set in an atmospheric pressure, it is unloaded in the air. Since the semiconductor wafer conveyed in the load lock chamber has a low temperature, e.g., about 0° C, the semiconductor wafer on which the chlorine-based gas is deposited is unloaded from the load lock chamber in the air. As a result, the semiconductor wafer unloaded in the air discharges harmful chlorine-based gas from its surface in a process of increasing the temperature of the semiconductor wafer to room temperature. The chlorine-based gas discharged in the air corrodes peripheral equipments of the etching apparatus not only to generate particles serving as secondary pollution sources but to adversely affect operators.

In addition, the chlorine-based gas deposited on the surface of the semiconductor wafer reacts with the wafer to generate reaction products, thereby considerably degrading the appearance of the semiconductor wafer.

When the cooled semiconductor wafer is unloaded in the air, droplets are attached to the surface of the semiconductor wafer. Since the droplets react with chlorine-based gas adsorbed in the wafer to generate a hydrochloric acid solution, the semiconductor wafer is wet-etched by the hydrochloric acid solution. As a result, etching accuracy is considerably degraded.

SUMMARY OF THE INVENTION

It is an object of the present invention to provide a surface-treating apparatus capable of etching an object to be treated with high accuracy, suppressing discharging of harmful gas deposited on the surface of the etched object in the air, and preventing the surface of the object from attachment of reaction products and droplets.

It is another object of the present invention to provide a surface-treating method capable of etching an object to be treated with high accuracy, suppressing discharging of harmful gas deposited on the surface of the etched object in the air, and preventing the surface of the object from attachment of reaction products and droplets.

According to the present invention, there is provided a surface-treating apparatus comprising a first process chamber for etching a loaded object to be treated with an activated etching gas, exhausting means for setting the first process chamber at a low pressure, cooling means for cooling the object loaded in the first process chamber, a second process chamber in which the object etched in the first process chamber is loaded, exhausting means for setting the second process chamber at a low pressure, and heating means for heating the object loaded in the second process chamber.

For example, a semiconductor wafer whose surface has a resist pattern can be used as the object to be treated.

In the surface-treating apparatus according to the present invention, since an object to be treated (a semiconductor wafer whose surface has a resist pattern) in the first process chamber is etched while the object is cooled by the cooling means, an excessive increase in resist temperature of the surface of the semiconductor wafer in the etching step can be suppressed. As a result, a highly accurate etching pattern faithful to the resist pattern can be transferred to the semiconductor wafer.

When the etched semiconductor wafer is conveyed in the second process chamber, and the semiconductor wafer is heated by the heating means, an etching gas (e.g., chlorine-based gas) deposited on the surface of the semiconductor wafer in the etching step can be discharged from the surface. As a result, after the second process chamber is set in the atmospheric pressure again, and the semiconductor wafer is unloaded in the air, discharging of harmful chlorine based gas from the surface of the semiconductor wafer can be prevented. Therefore, peripheral equipments of the etching apparatus are not corroded by the chlorine-based gas, and particles serving as secondary pollution sources are not generated, thereby improving an environment for operators. In addition, since the reaction between the semiconductor wafer and the chlorine-based gas deposited on the surface of the semiconductor wafer can be prevented, no reaction products are generated, and the appearance of the semiconductor wafer can be improved.

In addition, the semiconductor wafer is heated in the second process chamber at about at least room temperature to prevent the surface of the semiconductor wafer from attachment of droplets when the semiconductor wafer is unloaded in the air. As a result, since generation of droplets which react with the chlorine-based gas deposited on the semiconductor wafer to generate a hydrochloric acid solution can be suppressed, wet etching of the semiconductor wafer by the hydrochloric acid solution can be prevented. Therefore, since the semiconductor wafer is not wet-etched unlike a conventional technique after semiconductor wafer is unloaded in the air, a highly accurate etched state obtained in the first process chamber can be maintained.

According to the present invention, there is also provided a surface treating method comprising the steps of reacting an activated etching gas activated in a low-pressure atmosphere with an object to be treated while the object is cooled so as to etch the object; and heating the etched object in a low-pressure atmosphere or an inert atmosphere.

The object to be treated is preferably cooled to a temperature falling within a range of -190 to -10° C.

For example, a chlorine-based gas is used as the etching gas.

The activated etching gas is obtained by supplying an etching gas into a plasma. A plasma which is uniformed by a magnetic field generated by a magnetron can be used as the plasma.

The object is preferably heated at a temperature falling within a range of 50 to 100° C., more preferably, of 80 to 100° C. because of the following reasons. That is, since even carbon tetrachloride gas ($CCl_4$) as one of the etching gases used for etching of the object has a relatively low boiling point, i.e., 80° C. or less, the etching gas deposited on the surface of the object can be sufficiently discharged by heating at the above temperature. In addition, since a normal photoresist has a heat resistance of 120 to 140° C., the resist is not thermally affected by heating at the temperature.

In the surface-treating method according to the present invention, since the object (e.g., a semiconductor wafer whose surface has a resist pattern) is etched by the activated etching gas while the object is cooled, an excessive increase in resist temperature of the surface of the semiconductor wafer in the etching step can be suppressed. As a result, a highly accurate etching pattern faithful to the resist pattern can be transferred to the semiconductor wafer.

Since the etched semiconductor wafer is heated in a low-pressure atmosphere or an inert atmosphere, as described in the surface treating, discharging of the harmful chlorine-based gas from the surface of the semiconductor wafer after the semiconductor wafer is unloaded in the air can be prevented. In addition, when the semiconductor wafer is unloaded in the air, attachment of droplets to the surface of the semiconductor wafer can be prevented. Therefore, peripheral equipments of the etching apparatus are not corroded by the chlorine-based gas, and particles serving as secondary pollution sources are not generated, thereby improving an environment for operators and the appearance of the semiconductor wafer. In addition, a highly accurate etching state obtained by the etched gas can be maintained.

According to the present invention, there is further provided a surface-treating apparatus comprising a first process chamber to which an object to be treated is loaded, activating means for radiating an energy beam onto the object in the first process chamber, gas trapping means for trapping a gas discharged from a surface of the object upon radiation of the energy beam, and a second process chamber, to which the object in the first process chamber is loaded, for treating the surface of the object.

In the surface-treating apparatus according to the present invention, when a semiconductor wafer is loaded in the first process chamber in which the activating means and the trapping means are arranged, various gases deposited on the surface of the semiconductor wafer can be discharged and trapped. As a result, since the semiconductor wafer on which no gas is deposited can be conveyed to the second process chamber for surface-treating the semiconductor wafer, the second process chamber can be evacuated for a short time, and a degree of vacuum of the second process chamber can be increased to a predetermined value.

That is, various gases such as water, carbon monoxide, and carbon dioxide are adsorbed in the surface of a semiconductor wafer before surface treating such as etching is performed. The various gases are repetitively adsorbed and eliminated in/from the surface of the semiconductor wafer to be equilibrated. However, the semiconductor wafer is conveyed in a predetermined process chamber for performing surface treating such as etching, and the process chamber is evacuated by the operation of a vacuum pump, thereby setting the pressure acting on the semiconductor wafer at a low pressure. At this time, the gas adsorbed in the surface of the semiconductor wafer is gradually discharged from the wafer surface as an "out gas". This discharging phenomenon is continued for a relatively long time. Therefore, when the process chamber is evacuated by the operation of the vacuum pump, a considerably long time is required for achieving a predetermined degree of vacuum, and a throughput is decreased. In addition, the degree of vacuum of the process chamber may not be set to be the predetermined degree of vacuum depending on evacuation conditions. As a result, the surface of the semiconductor wafer in the process chamber cannot be preferably treated under desired conditions.

For this reason, according to the present invention, before the semiconductor wafer is conveyed in the second process chamber for performing surface treating, the semiconductor wafer is conveyed in the first process chamber in which the activating means and the gas trapping means are arranged. In the first process chamber, an energy beam radiated by the activating means is radiated onto the surface of the semiconductor wafer to enhance discharging (elimination) of gas adsorbed in the surface of the semiconductor wafer. In addition, the eliminated gas is trapped by the gas trapping means. As a result, the semiconductor wafer in which no gas is adsorbed can be conveyed to the second process chamber for performing surface treating. Therefore, since the second process chamber in which the semiconductor wafer is conveyed can be evacuated for a short time, a throughput can be increased. In addition, since the degree of vacuum of the second process chamber can be increased to a predetermined value, the surface of the semiconductor wafer can be preferably treated under desired conditions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be described below with reference to the accompanying drawings.

Embodiment 1

Figure 1:
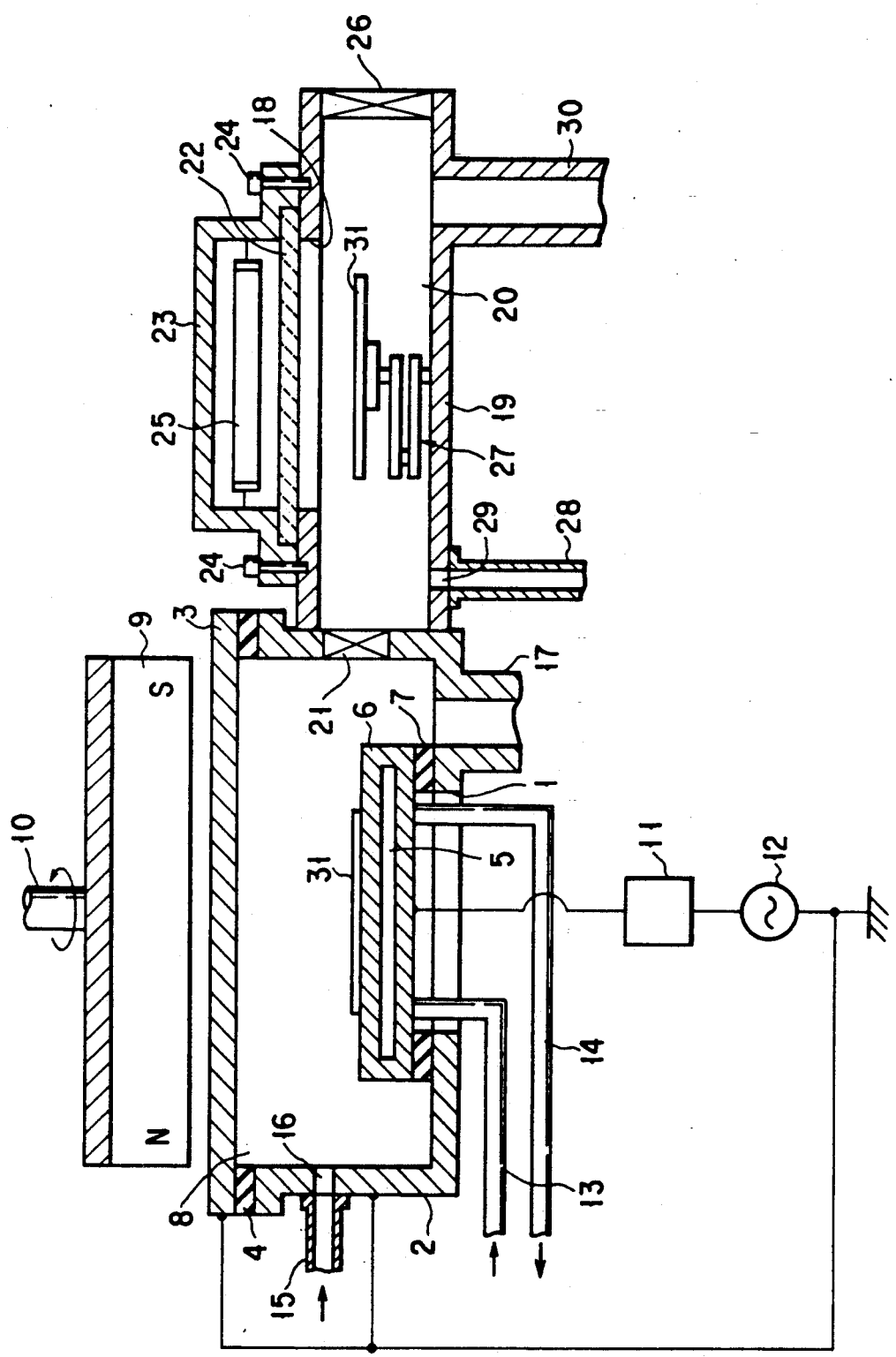
FIG. 1 is a sectional view showing a surfacetreating apparatus according to Embodiment 1 of the present invention.

FIG. 1 is a sectional view showing a surfacetreating apparatus (etching apparatus) according to this embodiment. A disk 3 also serving as an upper electrode is hermetically arranged on the upper surface of a vertical cylindrical member 2 having an opening 1 in its bottom portion. An annular insulating plate 4 is inserted between the cylindrical member 2 and the disk 3 to electrically insulate the cylindrical member 2 from the disk 3. A lower electrode 6 having a hollow portion 5 is hermetically arranged on the bottom portion of the cylindrical member 2 near the opening 1. An annular insulating plate 7 is inserted between the bottom portion of the cylindrical member 2 and the lower electrode 6 to electrically insulate the cylindrical member 2 from the lower electrode 6. The cylindrical member 2, the disk 3, and the lower electrode 6 consist of, e.g., sealed aluminum. An etching process chamber 8 serving as a first process chamber is formed by the cylindrical member 2, the disk 3, the annular insulating plate 4, the lower electrode 6, and the annular insulating plate 7.

A magnet 9 is arranged above the etching process chamber 8 to be opposite to the disk 3. A rotating shaft 10 is arranged on the upper portion of the magnet 9 to rotate the magnet 9 at a predetermined speed. A matching circuit 11 is connected to the bottom portion of the lower electrode 6. An RF power supply 12 is connected to the matching circuit 11. The RF power supply 12 is grounded, and the disk 3 and the cylindrical member 2 are grounded. A coolant supply pipe 13 and a coolant exhaust pipe 14 extend through the bottom portion of the lower electrode 6 to communicate with the hollow portion 5. A gas supply pipe 15 for supplying an etching gas is connected to the side wall of the cylindrical member 2. A gas circulating hole 16 is formed in the cylindrical member 2 to which the supply pipe 15 is connected. A gas exhaust pipe 17 is formed in the bottom portion of the cylindrical member 2. A vacuum pump (not shown) for evacuating the etching process chamber 8 is connected to the other end of the exhaust pipe 17.

A cylindrical member (not shown) for forming a loading load lock chamber is connected to the side wall of the cylindrical member 2. A first gate valve (not shown) is connected to the side wall of the cylindrical member 2 to which the load lock chamber is connected.

One end of a quadrangular cylindrical member 19 having a rectangular window hole 18 is hermetically connected to the side wall of the cylindrical member 2. An unloading load lock chamber 20 serving as a second process chamber is formed by the quadrangular cylindrical member 19. A second gate valve 21 is connected to the side wall of the cylindrical member 2 to which the quadrangular cylindrical member 19 is connected. A quartz window 22 consisting of quartz glass is placed on the upper wall of the quadrangular cylindrical member 19 in which the window hole 18 is formed. A box 23 is placed on the upper wall of the quadrangular cylindrical member 19 to cover the quartz window 22. A plurality of bolts 24 are threadably engaged with the upper wall of the quadrangular cylindrical member 19 from the box 23. For this reason, the quartz window 22 is tightly fixed between the box 23 and the upper wall of the quadrangular cylindrical member 19. 0-rings (not shown) are inserted between the quartz window 22 and the upper wall of the quadrangular cylindrical member 19 and between the quartz window 22 and the box 23, respectively, such that the quartz window 22 is hermetically held between the quadrangular cylindrical member 19 and the box 23.

A plurality (e.g., four) of 100-W halogen lamps 25 serving as heating means are arranged in the box 23 to be aligned in the horizontal direction. A third gate valve 26 is connected to an unloading outlet arranged at the other end of the quadrangular cylindrical member 19. A convey arm 27 for unloading an object to be treated, e.g., a semiconductor wafer, is arranged in the load lock chamber 20. A gas supply pipe 28 for supplying an inert gas such as $N_2$ gas is connected to the bottom portion of the quadrangular cylindrical member 19 near the second gate valve 21. A gas circulating hole 29 is formed in the bottom portion of the quadrangular cylindrical member 19 to which the supply pipe 28 is connected. A gas exhaust pipe 30 is connected to the bottom portion of the quadrangular cylindrical member 19 near the third gate valve 26. A vacuum pump (not shown) for evacuating the load lock chamber 20 is connected to the other end of the exhaust pipe 30.

Figure 2:
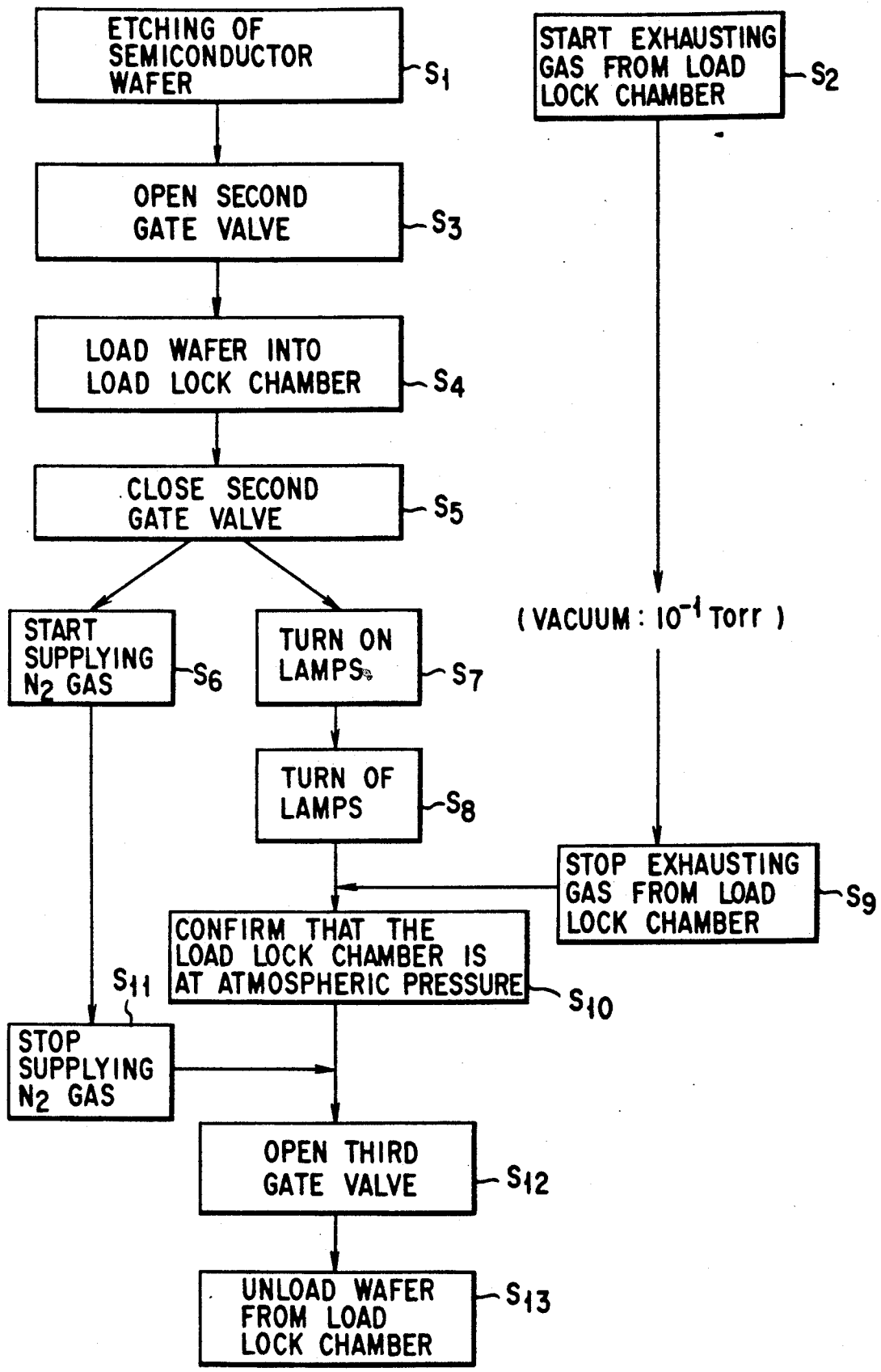
FIG. 2 is a flow chart showing a surface-treating step of Embodiment 1.

A method in which a semiconductor wafer (silicon wafer) whose surface has a resist pattern is etched by the etching apparatus shown in FIG. 1 will be described below with reference to the flow chart of FIG. 2.

First, a semiconductor wafer 31 in a loading load lock chamber (not shown) is loaded into the etching process chamber 8 through a first gate valve (not shown) and placed on the low electrode 6. After the first gate valve is closed, liquid nitrogen is supplied from the coolant supply pipe 13 to the hollow portion 5 of the low electrode 6, and the liquid nitrogen is exhausted through the coolant exhaust pipe 14, thereby cooling the semiconductor wafer 31 on the lower electrode 6 to, e.g., $-30°$ C. Subsequently, an etching gas (e.g., chlorine gas) is supplied to the etching process chamber 8 through the gas supply pipe 15 and the circulating pipe 16 at a flow rate of, e.g., 100 sccm. At the same time, the vacuum pump (not shown) is operated to exhaust the gas from the etching process chamber 8 through the exhaust pipe 17, thereby keeping the pressure in the etching process chamber 8 at a predetermined low-pressure atmosphere (e.g., 75 mTorr).

After this low-pressure state is stabled, an RF power having a predetermined frequency (e.g., 13.56 MHz) and a predetermined power (e.g., 150 W) is applied from the RF power supply 12 to the lower electrode 6 through the matching circuit 11 to change the chlorine gas in the etching process chamber 8 into a plasma. At the same time, the magnet 9 is rotated by the rotating shaft 10 at a speed of, e.g., 20 rpm, to uniform the density of the plasma. The semiconductor wafer 31 cooled on the low electrode 6 is etched by the action of the plasma for, e.g., 175 seconds. Thereafter, supply of the liquid nitrogen, application of the RF power, and supply of the chlorine are stopped (step $S_1$).

While the semiconductor wafer 31 is etched in the etching process chamber 8, a vacuum pump (not shown) is operated to exhaust gas from the load lock chamber 20 through the gas exhaust pipe 30, thereby setting the pressure of the load lock chamber 20 in a low-pressure atmosphere (e.g., $10^{-3}$ Torr) (step $S_2$).

The second gate valve 21 interposed between the etching process chamber 8 and the load lock chamber 20 is opened (step $S_3$).

The convey arm 27 arranged in the load lock chamber 20 is driven such that the semiconductor wafer 31 placed on the low electrode 6 in the etching process chamber 8 is loaded into the load lock chamber 20 through the second gate valve 21 (step $S_4$). The second gate valve 21 is closed to isolate the load lock chamber 21 from the etching process chamber 8 (step $S_5$).

An inert gas, e.g., $N_2$ gas, is supplied to the load lock chamber 20 through the gas supply pipe 28 and the gas circulating hole 29 (step $S_6$). At this time, an etching gas transported to the load lock chamber 20 is exhausted through the gas exhaust pipe 30. The load lock chamber 20 is set in a low-pressure atmosphere of $10^{-1}$ Torr by the supplying of the $N_2$ gas.

Figure 3:
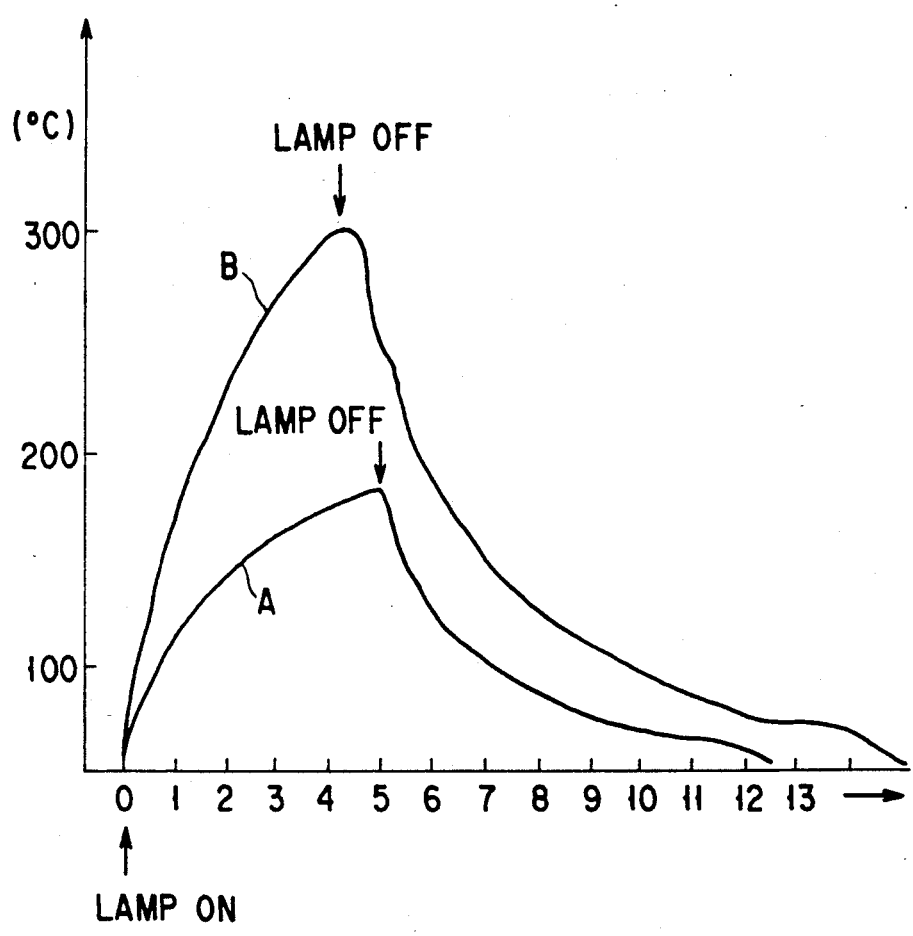
FIG. 3 is a graph showing a change in temperature of the surface of the semiconductor wafer when an energy beam from a lamp is radiated on the surface of the semiconductor wafer in different atmospheres.

After the etching gas transported to the load lock chamber 20 is exhausted, the four halogen lamps 25 are turned on to radiate energy beams through the quartz window 22 onto the semiconductor wafer 31 supported by the convey arm 27 in the load lock chamber 20 (step $S_7$). The semiconductor wafer 31 is heated by turning on the lamps 25 such that the temperature of the semiconductor wafer 31 is increased in accordance with a curve A shown in FIG. 3. However, when the lamps 25 are turned on while the load lock chamber 20 is set in a low-pressure atmosphere, the temperature of the semiconductor wafer 31 is sharply increased in accordance with a curve B shown in FIG. 3. The energy beam radiation is performed for, e.g., 60 minutes, to increase the surface temperature of the semiconductor wafer 31 to about room temperature. For this reason, when the semiconductor wafer 31 is etched in the etching process chamber 8 while the semiconductor wafer 31 is cooled, an etching production gas (carbon tetrachloride gas) deposited on the surface of the semiconductor wafer 31 is discharged. The discharged etching production gas is exhausted through the gas exhaust pipe 30 together with the $N_2$ gas supplied from the gas supply pipe 28.

The energy beam radiation from the lamps 25 is stopped (step $S_8$). Subsequently, the operation of the vacuum pump is stopped to stop the evacuation of the load lock chamber 20 (step $S_9$). Thereafter, after it is confirmed that the load lock chamber 20 is set in the atmospheric pressure (step $S_{10}$), the $N_2$ gas supply is stopped (step $S_{11}$).

The third gate valve 26 arranged on the load lock chamber 20 is opened (step $S_{12}$) Thereafter, the convey arm 27 is driven such that the semiconductor wafer 31 in the load lock chamber 20 is unloaded outside through the third gate valve (step $S_{13}$).

The surface of the semiconductor wafer treated in Embodiment 1 and unloaded from the load lock chamber 20 was observed with a microscope. As a result, the silicon wafer and the resist pattern had preferable shapes, respectively. In addition, any reaction products and droplets attached to the surface of the semiconductor wafer 31 were not detected, and the semiconductor wafer 31 was etched faithfully to the resist pattern with a preferable appearance.

In contrast to this, when the semiconductor wafer was not heated in the load lock chamber, deposition products seemed to be reaction products could be observed especially on the side wall of the silicon wafer.

The semiconductor wafer 31 unloaded from the load lock chamber 20 was dipped in distilled water to elute residual chlorine of the wafer 31 in the distilled water, and an amount of residual chlorine was measured by ion chromatography. As a result, it was confirmed that the amount of residual chlorine was decreased to be half that of a semiconductor wafer which was not heated in the load lock chamber.

As described above, according to Embodiment 1, etching can be preferably performed such that the semiconductor wafer 31 is prevented from deposition of reaction products such as carbon tetrachloride and droplets. An amount of residual chlorine in the semiconductor wafer 31 can be decreased to suppress discharging of a chlorine-based gas in the air.

In Embodiment 1 described above, the load lock chamber serving as the second process chamber may have not only heating means but a gas trapping mechanism to be described later in FIGS. 6 and 9.

In Embodiment 1, although a halogen lamp is used as heating means, another lamp may be used in place of the halogen lamp.

In Embodiment 1, although the loading and unloading load lock chambers are arranged for the etching process chamber, one load lock chamber may be commonly used for loading and unloading operations.

In Embodiment 1, although the magnet for uniforming a plasma is arranged above the etching process chamber, the magnet need not be arranged.

Embodiment 2

Figure 4:
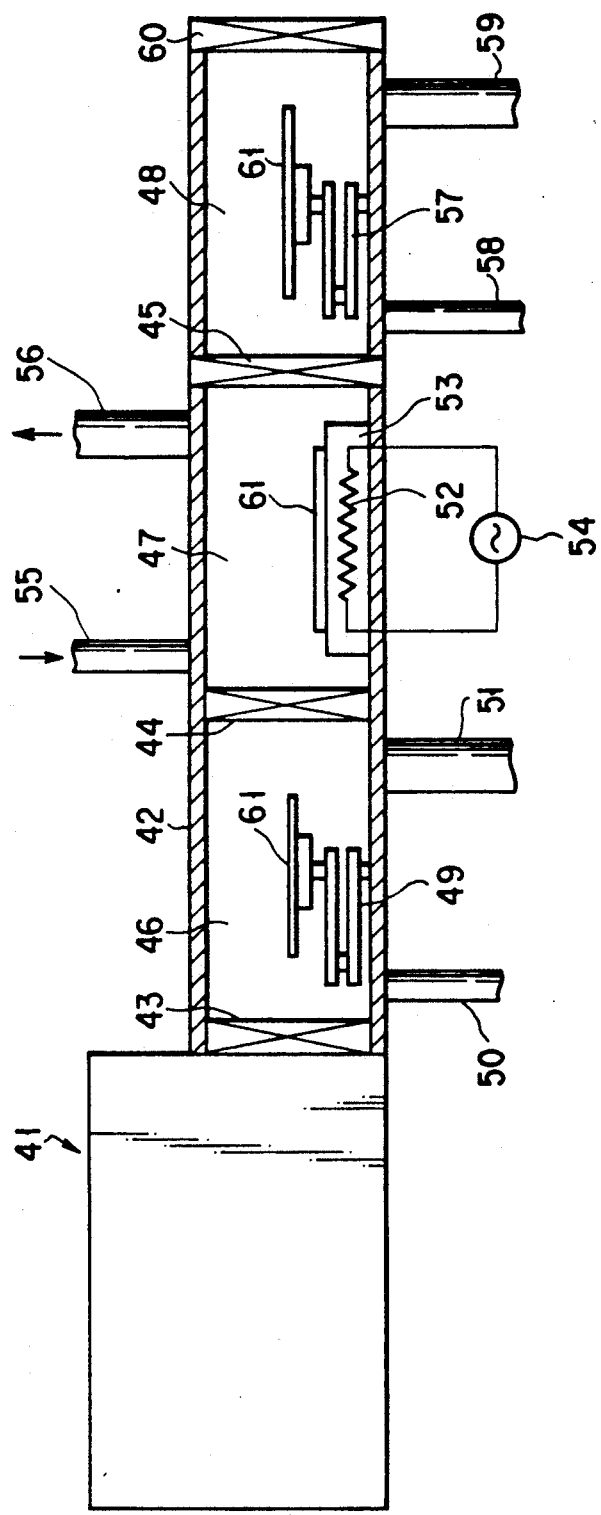
FIG. 4 is a sectional view showing a surfacetreating apparatus according to Embodiment 2 of the present invention.

FIG. 4 is a sectional view showing a surface-treating apparatus (etching apparatus) according to Embodiment 2. An etching process chamber 41 serving as a first process chamber has the same structure as that of Embodiment 1. An elongated quadrangular cylindrical member 42 is connected to the etching process chamber 41. A cylindrical member (not shown) for forming a loading load lock chamber is connected to the etching process chamber 41. A first gate valve (not shown) is connected to the etching process chamber 41 to which the load lock chamber is connected.

A second gate valve 43 is arranged at the connection portion between the etching process chamber 41 and the quadrangular cylindrical member 42. Third and fourth gate valves 44 and 45 are arranged in the quadrangular cylindrical member 42, and a first load lock chamber 46, a heating chamber 47, and a second load lock chamber for a loading operation are formed in the quadrangular cylindrical member 42 to be sequentially arranged from the etching process chamber 41 side.

A first convey arm 49 is arranged in the first load lock chamber 46. A first gas supply pipe 50 and a first gas exhaust pipe 51 are connected to the bottom portion of the quadrangular cylindrical member 42 in which the first load lock chamber 46 is formed.

A wafer table 53 incorporating a heater 52 is arranged in the heating chamber 47. An AC power supply 54 is connected to the heater 52. A second gas supply pipe 55 and a second gas exhaust pipe 56 are connected to the upper wall of the quadrangular cylindrical member 42 in which the heating chamber 47 is formed.

A second convey arm 57 is arranged in the second load lock chamber 48. A third gas supply pipe 58 and a third gas exhaust pipe 59 are connected to the bottom portion of the quadrangular cylindrical member 42 in which the second load lock chamber 48 is formed. A fifth gate valve 60 is connected to the other end of the quadrangular cylindrical member 42 in which the second load lock chamber 48 is formed.

A vacuum pump (not shown) is arranged at the other end of each of the first to third gas exhaust pipes 51, 56, and 59.

A method in which a semiconductor wafer (silicon wafer) whose surface has a resist pattern is etched by the etching process apparatus shown in FIG. 4 will be described below.

First, as described in Embodiment 1, a semiconductor wafer is etched in the etching process chamber 41 while the semiconductor wafer is cooled to $-30°$ C.

While the etching operation of the semiconductor wafer is performed in the etching process chamber 41, the vacuum pumps (not shown) are operated to exhaust gas from the first load lock chamber 46, the heating chamber 47, and the second load lock chamber 48 through the first to third gas exhaust pipes 51, 56, and 59, and these chambers are set in a predetermined low-pressure atmosphere (e.g., $10^{-3}$ Torr)

After the second gate valve 43 interposed between the etching process chamber 41 and the first load lock chamber 46 is opened, the first convey arm 49 is driven such that a semiconductor wafer 61 in the etching process chamber 41 is loaded into the first load lock chamber 46 through the second gate valve 43. The second gate valve 43 is closed to isolate the first load lock chamber 46 from the etching process chamber 41.

While the vacuum pumps are continuously operated, an inert gas (e.g., $N_2$ gas) is supplied to the first load lock chamber 46 through the first gas supply pipe 50 such that an etching gas supplied from the etching process chamber 41 is exhausted through the first exhaust pipe 51.

After the third gate valve 44 interposed between the first load lock chamber 46 and the heating chamber 47 is opened, the first convey arm 49 is driven such that the semiconductor wafer 61 in the first load lock chamber 46 is loaded on the wafer table 53 in the heating chamber 47 through the third gate valve 44. The third gate valve 43 is closed to isolate the heating chamber 47 from the first load lock chamber 46.

While the vacuum pumps are continuously operated, an inert gas (e.g., $N_2$) is supplied to the heating chamber 47 through the second gas supply pipe 55.

At the same time, the AC power supply 54 applies an AC voltage to the heater 52 incorporated in the wafer table 53 to heat the heater 52 to, e.g., 100° C. Heating of the heater 52 increases the surface temperature of the semiconductor wafer 61 on the wafer table 53 to about room temperature. For this reason, when an etching operation is performed in the etching process chamber 41 while the semiconductor wafer 61 is cooled, an etching production gas (carbon tetrachloride) deposited on the surface of the semiconductor wafer 61 is discharged. The discharged etching production gas is exhausted through the second gas exhaust pipe 56 together with the $N_2$ gas supplied from the second gas supply pipe 55.

After application of the AC voltage is stopped, the fourth gate valve 45 interposed between the heating chamber 47 and the second load lock chamber 48 is opened. The second convey arm 57 is driven such that the semiconductor wafer 61 mounted on the wafer table 53 in the heating chamber 47 is loaded in the second load lock chamber 48 through the fourth gate valve 45. The fourth gate valve 45 is closed to isolate the second load lock chamber 48 from the heating chamber 47.

The operations of the vacuum pumps are stopped to supply an inert gas (e.g., $N_2$) to the second load lock chamber 48 through the third gas supply pipe 59. After it is confirmed that the second load lock chamber 48 is set in the atmospheric pressure, supply of the $N_2$ gas is stopped. The fifth gate valve 60 of the second load lock chamber 43 is opened. Thereafter, the second convey arm 57 is driven such that the semiconductor wafer 61 in the second load lock chamber 48 is unloaded outside through the fifth gate valve 60.

The surface of the above semiconductor wafer treated in Embodiment 2 and unloaded from the second load lock chamber 48 was observed with a microscope. As a result, both the silicon wafer and the resist pattern had preferable shapes, respectively. In addition, reaction products and droplets deposited/attached to the surface of the silicon wafer 61 were not detected, and the silicon wafer was etched faithfully to the resist pattern to have a good appearance.

The semiconductor wafer 61 unloaded from the load lock chamber 48 was dipped in distilled water to elute residual chlorine of the wafer 61 in the distilled water, and an amount of residual chlorine was measured by ion chromatography. As a result, it was confirmed that the amount of residual chlorine was decreased to be half that of a semiconductor wafer which was not heated in the load lock chamber.

As described above, according to Embodiment 2, etching can be preferably performed such that the semiconductor wafer 61 is prevented from deposition/attachment of reaction products such as carbon tetrachloride and droplets. An amount of residual chlorine in the semiconductor wafer 61 can be decreased to suppress discharging of the chlorine-based gas in the air.

Embodiment 3

Figure 5:
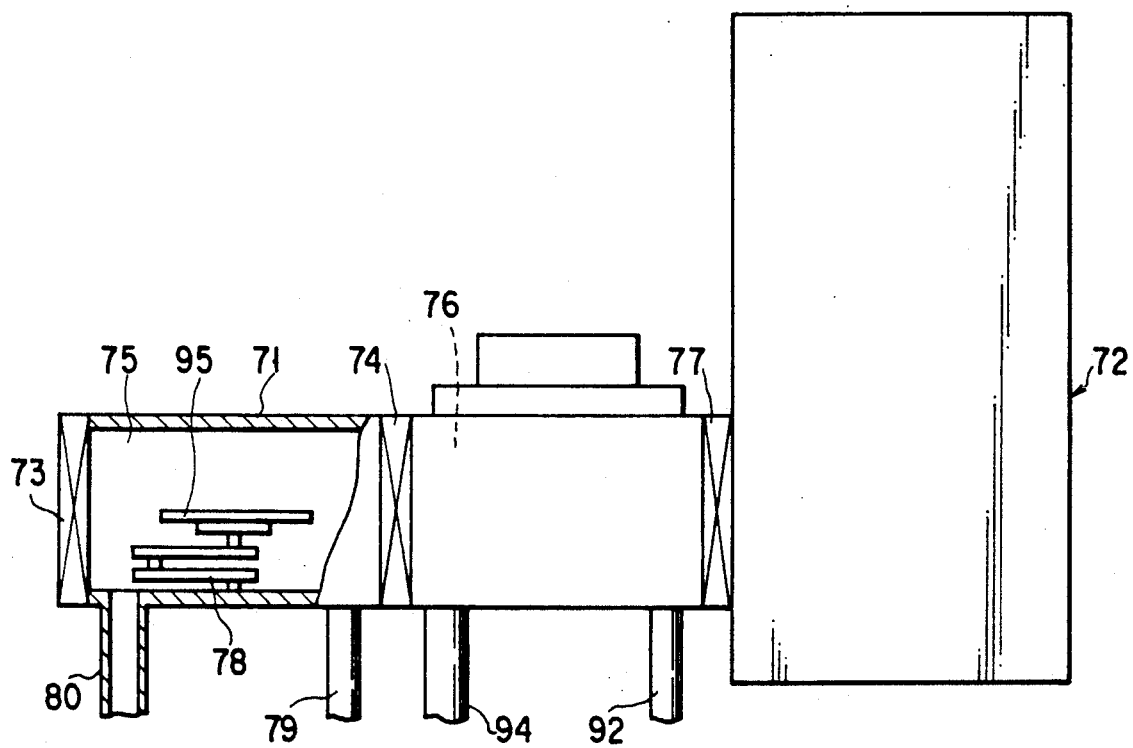
FIG. 5 is a partially cutaway front view showing a surface-treating apparatus according to Embodiment 3 of the present invention.
Figure 7:
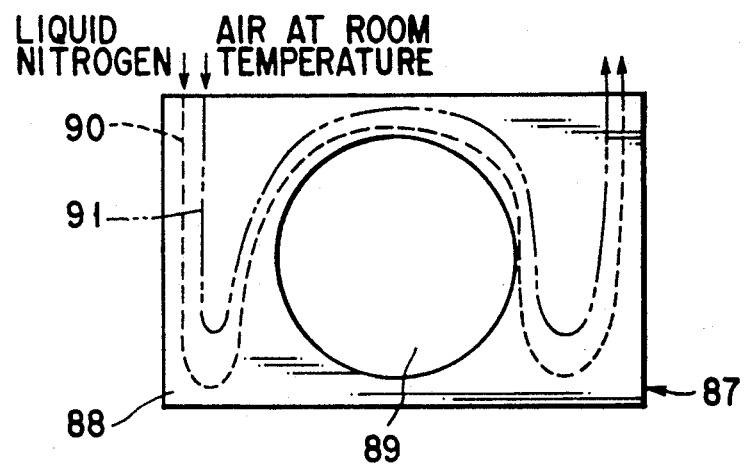
FIG. 7 is a plan view showing a gas trapping member arranged in the degassing chamber in FIG. 6.
Figure 8:
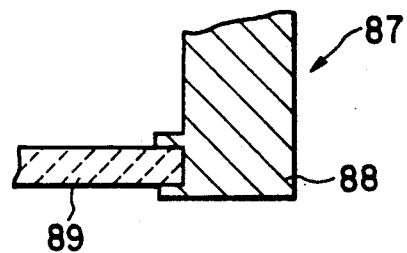
FIG. 8 is a sectional view showing a main part of the gas trapping member in FIG. 7.

20 FIG. 5 is a partially cutaway front view showing a surface-treating apparatus (plasma etching apparatus) according to Embodiment 3. FIG. 6 is a sectional view showing a degassing chamber incorporated in the surfacetreating apparatus in FIG. 5, FIG. 7 is a plan view showing a gas trapping mechanism arranged in the degassing chamber in FIG. 6, and FIG. 8 is a sectional view showing a main part of the gas trapping mechanism in FIG. 7.

One end of a quadrangular cylindrical member 71 is connected to a plasma etching process chamber 72 serving as a second process chamber. A first gate valve 73 is connected to at the other end of the quadrangular cylindrical member 71. A second gate valve 74 is arranged in the quadrangular cylindrical member 71, such that a loading load lock chamber 75 and a degassing chamber 76 serving as a first process chamber are formed in the quadrangular cylindrical member 71. A third gate valve 77 is arranged at the connection portion between the quadrangular cylindrical member 71 and the process chamber 72.

A convey arm 78 for conveying an object to be treated such as a semiconductor wafer is arranged on the bottom portion in the load lock chamber 75. A first gas supply pipe 79 and a first gas exhaust pipe 80 are connected to the bottom portion of quadrangular cylindrical member 71 in which the loading load lock chamber 75 is formed. A vacuum pump (not shown) is connected to the other end of the gas exhaust pipe 80.

Figure 6:
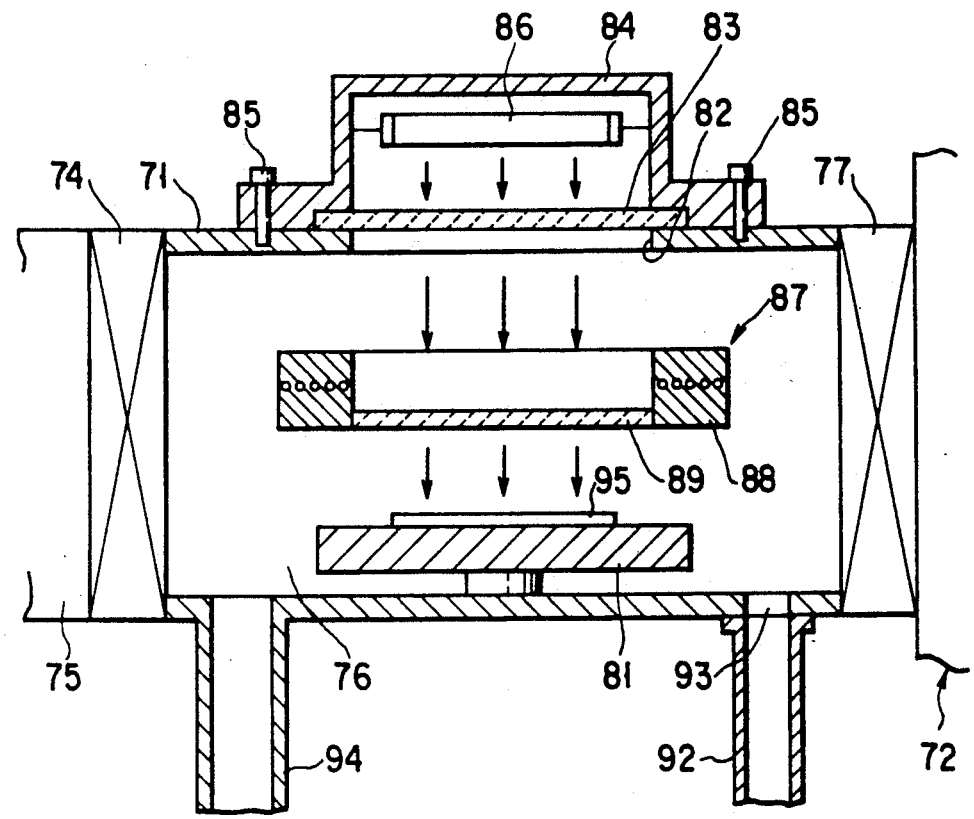
FIG. 6 is a sectional view showing a degassing chamber incorporated in the surface-treating apparatus in FIG. 5.

A chuck plate 81, as shown in FIG. 6, is arranged on the bottom portion in the degassing chamber 76. A rectangular window hole 82 is formed in the upper portion of the quadrangular cylindrical member 71 in which the degassing chamber 76 is formed. A quartz window 83 consisting of quartz glass is placed on the upper wall of the quadrangular cylindrical member 71 in which the window hole 82 is formed. A box 84 is placed on the upper wall of the quadrangular cylindrical member 71 to cover the quartz window 83. A plurality of bolts 85 are threadably engaged with the upper wall of the quadrangular cylindrical member 71 from the box 84. For this reason, the quartz window 83 is tightly fixed between the box 84 and the upper wall of the quadrangular cylindrical member 71. 0-rings (not shown) are inserted between the quartz window 83 and the upper wall of the quadrangular cylindrical member 71 and between the quartz window 83 and the box 84, respectively, such that the quartz window 83 is hermetically held between the quadrangular cylindrical member 71 and the box 84.

A plurality (e.g., four) of 100-W halogen lamps 86 serving as activating means are arranged in the box 84 to be aligned in the horizontal direction.

A gas trapping mechanism 87 is arranged in the degassing chamber 76 between the chuck plate 81 and the halogen lamps 86. The gas trapping mechanism 87, as shown in FIGS. 6 and 7, has a frame 88 consisting of, e.g., aluminum. A transparent trapping plate 89 consisting of, e.g., quartz glass, as shown in FIG. 8, is connected to the frame 88 by silver-brazing to be opposite to the chuck plate 81. A coolant path 90, to which liquid nitrogen is supplied, and a heat medium path 91, to which air heated at room temperature is supplied, are windingly formed throughout the entire area of the frame 88. Liquid nitrogen is supplied to the coolant path 90 to cool the transparent trapping plate 89. Air heated at room temperature is supplied to the heat medium path 91 to heat the transparent trapping plate 89.

A second gas supply pipe 92 is connected to the bottom portion of the quadrangular cylindrical member 71 near the third gate valve 77. A gas circulating hole 93 is formed in the bottom portion of the quadrangular cylindrical member 71 to which the supply pipe 92 is connected. A second gas exhaust pipe 94 is connected to the bottom portion of the quadrangular cylindrical member 71 in which the degassing chamber 76 is formed near the second gate valve 74. A vacuum pump (not shown) for evacuating the degassing chamber 76 is connected to the other end of the supply pipe 94. A convey arm (not shown) is arranged in the degassing chamber 76.

A third gas supply pipe and a third gas exhaust pipe (neither are shown) are connected to the plasma etching process chamber 72. An unloading load lock chamber (not shown) is connected to the side wall of the process chamber 72. A fourth gate valve (not shown) is arranged at the connection portion between the process chamber 72 and the unloading load lock chamber.

An operation of the plasma etching apparatus shown in FIGS. 5 to 8 will be described below.

After the first gate valve 73 of the loading load lock chamber 75 is opened, the convey arm 78 is driven such that an object to be treated, e.g., a semiconductor wafer 95 whose surface has a resist pattern is loaded in the load lock chamber 75 through the first gate valve 73. After the first gate valve 73 is closed, a vacuum pump (not shown) is operated to evacuate the load lock chamber 75 through the first gas exhaust pipe 80 and to set the load lock chamber 75 in a predetermined low-pressure atmosphere. At this time, a vacuum pump (not shown) is operated to evacuate gas in the degassing chamber 76 through the second gas exhaust pipe 94 and to set the degassing chamber 76 in a predetermined low-pressure atmosphere.

While the pumps are continuously operated, the second gate valve 74 interposed between the load lock chamber 75 and the degassing chamber 76 is opened. Subsequently, the convey arm 78 is driven such that the semiconductor wafer 95 in the load lock chamber 75 is loaded on the chuck plate 81 in the degassing chamber 76 through the second gate valve 74. The second gate valve 74 is closed to isolate the degassing chamber 76 from the load lock chamber 75.

The halogen lamps 86 arranged above the degassing chamber 76 are turned on to emit an energy beam. The emitted energy beam is radiated onto the semiconductor wafer 95 on the chuck plate 81 through the transparent trapping plate 89 of the gas trapping mechanism 87 and the quartz window 83 consisting of quartz glass. As a result, water and gases such as carbon dioxide and hydrogen adsorbed in the surface of the semiconductor wafer 95 are activated by radiation of the energy beam and eliminated from the surface of the semiconductor wafer 95 as an "out gas" to be discharged. When the energy beam is radiated onto the semiconductor wafer 95 to activate the gas adsorbed in its surface, discharging of the gas from the surface of the semiconductor wafer 95 is enhanced compared with a case wherein the gas is simply evacuated.

Prior to radiation of the energy beam from the halogen lamp 86, for example, liquid nitrogen having a boiling point of -196° C. is supplied to the coolant path 90 of the frame 88 of the gas trapping mechanism 87. The liquid nitrogen is circulated in the frame 88 such that the transparent trapping plate 89 fixed to the frame 88 is cooled to a very low temperature. As a result, the gas discharged from the surface of the semiconductor wafer 95 is brought into contact with the cooled transparent trapping plate 89 arranged above the semiconductor wafer 95 and is trapped due to a condensation operation. Since the gas trapped by the transparent trapping plate 89 is cooled to a very low temperature, the gas loses its energy and is not easily eliminated. As described above, since the gas discharged from the surface of the semiconductor wafer 95 is immediately trapped by the gas trapping mechanism 87, the gas is rapidly removed from the atmosphere of the degassing chamber 76.

After the trapping operation is performed in the degassing chamber 76 for a predetermined time, the third gate valve 77 interposed between the degassing chamber 76 and the plasma etching chamber 72 which is set in a predetermined low-pressure atmosphere by evacuation in advance is opened. Subsequently, a convey arm (not shown) arranged in the degassing chamber 76 is driven such that the semiconductor wafer 95 on the chuck plate 81 of the degassing chamber 76 is loaded in the plasma etching chamber 72 through the third gate valve 77.

The above operations are repeated to load a predetermined number (e.g., 25) of non treated semiconductor wafers 95 in the plasma etching chamber 72. Subsequently, after the third gate valve 77 is closed, a vacuum pump (not shown) is operated to exhaust the gas from the process chamber 72 through a third gas exhaust pipe (not shown) connected to the process chamber 72. Thereafter, an etching gas is supplied to the process chamber 72, and a plasma is generated to activate the etching gas, thereby etching the plurality of semiconductor wafers by the activated etching gas.

On the other hand, after a predetermined number of semiconductor wafers are loaded in the process chamber 72, the gas trapped by the gas trapping mechanism 87 is purged by the following operations.

After the second and third gate valves 74 and 77 are closed, while the vacuum pumps are continuously operated, an inert gas (e.g., $N_2$ gas) is supplied to the degassing chamber 76 through the second gas supply pipe 92. The liquid nitrogen supplied to the coolant path 90 of the frame 88 is stopped. Air kept at room temperature is supplied to the heat medium path 91 of the frame 88. Therefore, the trapping plate 89 cooled by circulation of the liquid nitrogen is heated, the gas trapped by the transparent trapping plate 89 is discharged again, and the gas is exhausted outside through the second gas exhaust pipe 94 together with the $N_2$ gas supplied to the degassing chamber 76.

As described above, according to Embodiment 3, when an energy beam emitted from the halogen lamp 86 is radiated onto the surface of the semiconductor wafer 95 in the degassing chamber 76, discharging of the gas adsorbed in the surface of the semiconductor wafer 95 can be enhanced, and the discharged "out gas" can be immediately trapped by the gas trapping mechanism 87. As a result, the semiconductor wafer 95 processed in the degassing chamber 76 is conveyed in the plasma etching process chamber 72. When the process chamber 72 is set in a low-pressure atmosphere, since no various gases are adsorbed in the surface of the semiconductor wafer 95, the process chamber 72 can be rapidly set in a predetermined degree of vacuum for a short time, and the degree of vacuum can be set to be high. Therefore, plasma etching can be performed to the semiconductor wafer 95 with a high throughput, and preferable plasma etching can be performed.

Although a halogen lamp is used as an activating means in Embodiment 3, this embodiment is not limited to this lamp. For example, another lamp or a laser oscillator may be used in place of the halogen lamp.

Although the coolant path 90 and the heat medium path 91 are formed in the frame 88 of the gas trapping mechanism 87 in Embodiment 3, this embodiment is not limited to this arrangement. For example, a common path for supplying a coolant and a heat medium is windingly formed in the frame. In the gas trapping mechanism including the frame having the above structure, a coolant flows in the path when the transparent trapping plate of the gas trapping mechanism is to be cooled. When the transparent trapping plate is to be heated, a heat medium is switched in place of the coolant to flow in the path.

In Embodiment 3, although liquid nitrogen is used as the coolant, cold water (about -30° C.) containing an antifreeze or cooling gas may be used in place of the liquid nitrogen.

In Embodiment 3, although air kept at room temperature is used as the heat medium, another gas such as nitrogen kept at room temperature or warm water may be used in place of the air.

Although the first process chamber consists of the loading load lock chamber 75 and the degassing chamber 76 in the above embodiment, the embodiment is not limited to this arrangement. For example, the first process chamber may be a loading load lock chamber or a loading/unloading load lock chamber.

Embodiment 4

Figure 9:
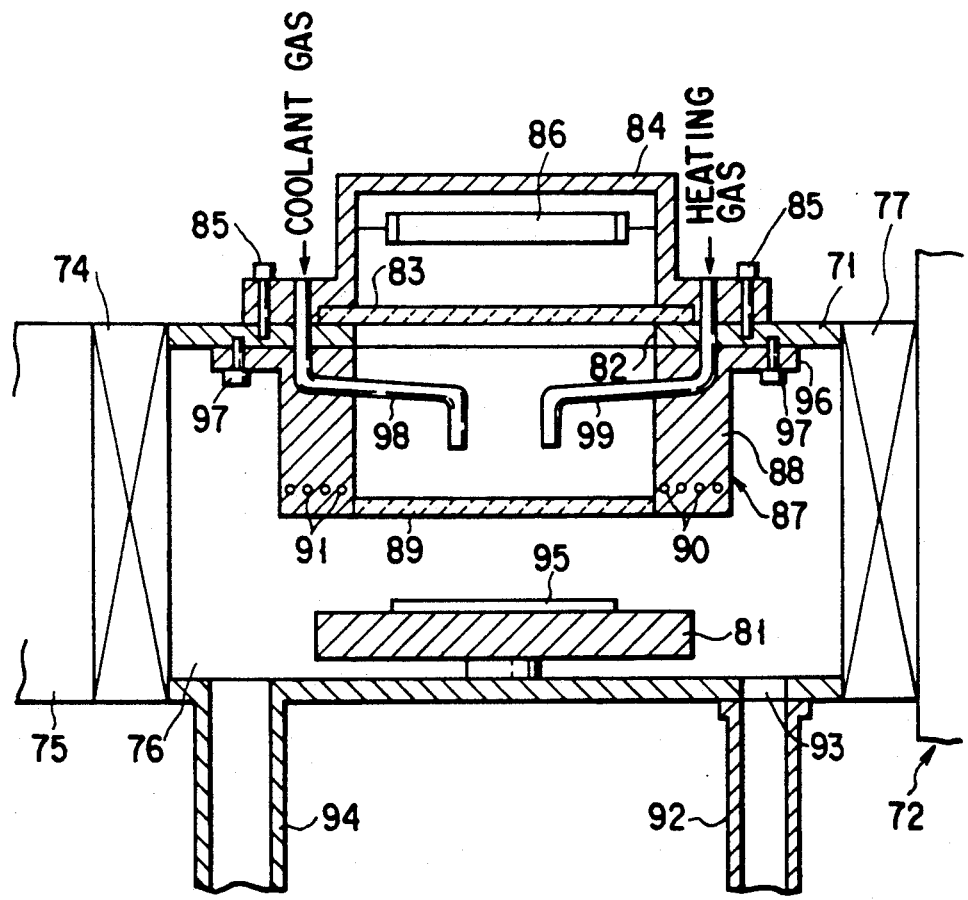
FIG. 9 is a sectional view showing a degassing chamber incorporated in the surface-treating apparatus according to Embodiment 4 of the present invention.

FIG. 9 is a sectional view showing a degassing chamber incorporated in a surface-treating apparatus (plasma etching apparatus) according to Embodiment 4 of the present invention. The same reference numerals as in FIG. 6 denote the same parts in FIG. 9, and a detailed description thereof will be omitted.

A gas trapping mechanism 87 arranged in a degassing chamber 76 has the following structure. A frame 88 consisting of, e.g., aluminum, and having a flange portion 96 at its upper end is arranged such that the flange portion 96 is brought into contact with the inner surface of the upper wall of a quadrangular cylindrical member 71 consisting of, e.g., stainless steel. A plurality of bolts 97 are threadably engaged with the upper wall of the quadrangular cylindrical member 71 from the flange portion 96. An 0-ring (not shown) is inserted between the flange 96 and the upper wall of the quadrangular cylindrical member 71 to hermetically fix the frame 88 to the quadrangular cylindrical member 71. A transparent trapping plate 89 consisting of, e.g., quartz glass is connected to the frame 88 by silver-brazing to be opposite to a chuck plate 81. A coolant path 90 to which, for example, liquid nitrogen is supplied and a heat medium path 91 to which, for example, air kept at room temperature is supplied are windingly formed throughout the area of the frame 88. A coolant gas supply nozzle 98 is arranged to extend through a box 84, the upper wall of the quadrangular cylindrical member 71, and the frame 88, and the distal end of the nozzle 98 extends to be located near the upper surface of the transparent trapping plate 89. A heating gas supply nozzle 99 is arranged to extend through the box 84, the upper wall of the quadrangular cylindrical member 71, and the frame 88, and the distal end of the nozzle extends to be located near the upper surface of the transparent trapping plate 89.

In the surface-treating apparatus according to Embodiment 4, the gas trapping mechanism 87 including the coolant gas supply nozzle 98 and the heating gas supply nozzle 99 is arranged in the degassing chamber 76. For this reason, when liquid nitrogen having a boiling point of $-196°$ C. is supplied to the coolant path 90 of the frame 88, and the cooling gas supplied from the cooling gas supply nozzle 98 is sprayed on the upper surface of the transparent trapping plate 89 attached to the frame 88, the transparent trapping plate 89 can be rapidly cooled. As a result, when an energy beam emitted from the halogen lamp 86 is radiated onto a semiconductor wafer 95 loaded on the chuck plate 81 in the degassing chamber 76 to discharge the gas adsorbed in the surface of the semiconductor wafer 95, an "out gas" can be rapidly trapped by the transparent trapping plate 89.

Supply of the liquid nitrogen to the coolant path 90 of the frame 88 is stopped, air kept at room temperature is supplied to the heat medium path of the frame 88, and heated air supplied from the heating gas supply nozzle 99 is sprayed on the upper surface of the transparent trapping plate 89 attached to the frame 88, thereby rapidly heating the transparent trapping plate 89. As a result, the transparent trapping plate 89 cooled by the above operations can be rapidly heated. Therefore, various gases trapped by the transparent trapping plate 89 can be rapidly discharged again and exhausted outside the degassing chamber 76 through a second gas exhaust pipe 94.

Although cooling and heating gases are sprayed on the transparent trapping plate 89 of the gas trapping means 87 using the two gas supply nozzles 98 and 99 in Embodiment 4, the embodiment is not limited to this arrangement. For example, one gas supply nozzle may be commonly used for spraying cooling and heating gases.

Embodiment 5

Figure 10:
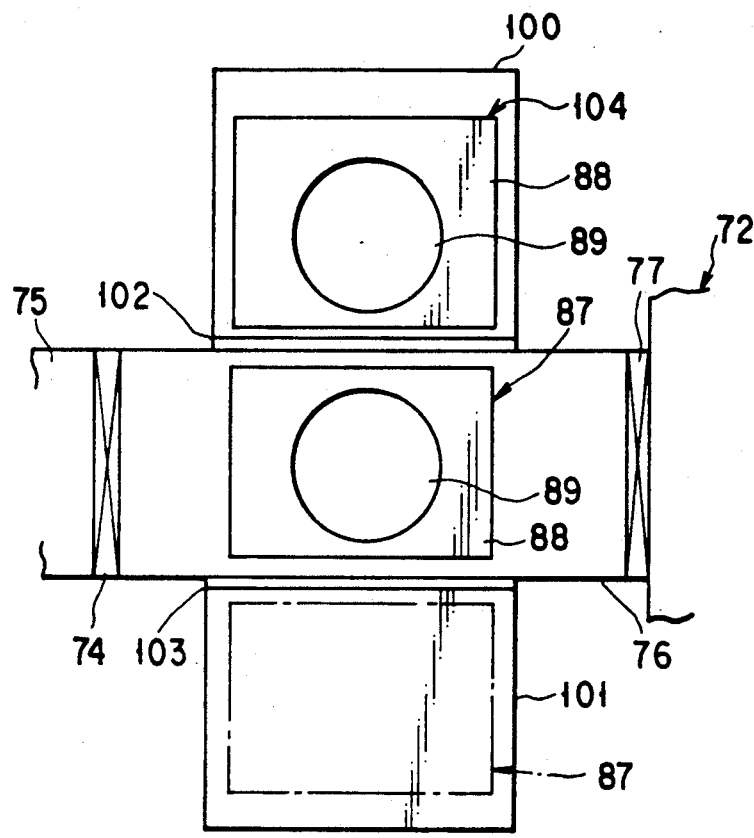
FIG. 10 is a plan view showing a degassing chamber and its peripheral structure incorporated in a surface-treating apparatus according to Embodiment 5 of the present invention.

FIG. 10 is a sectional view showing a degassing chamber and its peripheral structure incorporated in a surface-treating apparatus (plasma etching apparatus) according to Embodiment 5 of the present invention. The same reference numerals as in FIG. 6 denote the same parts in FIG. 10, and a detailed description thereof will be omitted.

First and second preliminary process chambers 100 and 101 are arranged on both the side walls of the quadrangular cylindrical member 71 to sandwich it. A degassing chamber 76 is formed in the quadrangular cylindrical member 71. Gas supply pipes (not shown) are connected to the preliminary process chambers 100 and 101, respectively. Fifth and sixth gate valves 102 and 103 are arranged at the connection portion between the preliminary process chamber 100 and the quadrangular cylindrical member 71 and the connection portion between the preliminary process chamber 101 and the quadrangular cylindrical member 71, respectively. A gas trapping mechanism (first gas trapping mechanism) 87 having a frame 88 and a transparent trapping plate 89 is arranged in the degassing chamber 76. The first gas trapping mechanism 87 can be moved between the degassing chamber 76 and the second preliminary process chamber 101 through the sixth gate valve 103. A second gas trapping mechanism 104 having the same structure as that of the first gas trapping mechanism 87 is arranged in the first preliminary process chamber 100. A second gas trapping mechanism 104 can be moved between the first preliminary process chamber 100 and the degassing chamber 76 through the fifth gate valve 102.

According to the surface-treating apparatus of Embodiment 5, after an operation in which a gas discharged from the surface of a semiconductor wafer is trapped by the transparent trapping plate 89 of the first gas trapping mechanism 87 in the degassing chamber 76 is performed a predetermined number of times, the sixth gate valve 103 is opened, and the first gas trapping mechanism 87 is moved into the second preliminary process chamber 101 through the sixth gate valve 103. Subsequently, after the sixth gate valve 103 is closed, the fifth gate valve 102 is opened, and the second gas trapping mechanism 104 is moved from the first preliminary process chamber 100 to the degassing chamber 76 through the fifth gate valve 102. Continuously, the gas discharged from the surface of the semiconductor wafer is trapped in the degassing chamber 76 using the second gas trapping mechanism 104. While the above trapping operation is performed, a purging operation of the first gas trapping mechanism 87 moved into the second preliminary process chamber 102 is performed. That is, the transparent trapping plate 89 of the first gas trapping mechanism 87 is heated to discharge various gases trapped by the transparent trapping plate 89 again, and an inert gas, e.g., N2 gas is supplied from a gas supply pipe (not shown) to the second preliminary process chamber 102. A vacuum pump (not shown) is operated to exhaust the above "out gases" outside through a gas exhaust pipe (not shown) together with the $N_2$ gas.

Therefore, since the trapping operation and the purging operation for the gas discharged from the surface of the semiconductor wafer can be simultaneously performed, a throughput can be considerably increased.

Although the first and second gas trapping mechanisms 87 and 104 are independently arranged in Embodiment 5, the embodiment is not limited to this arrangement. For example, two frames having the transparent trapping plate may be integrally connected to each other. In this case, a heat insulator is arranged between the transparent trapping plates, and an extendible bellows pipe is used as a pipe for a coolant or heat medium. In addition, bellows-like chucks are used in place of the gate valves arranged between the degassing chamber and the first preliminary process chamber and between the degassing chamber and the second preliminary process chamber.

Although a plasma etching process chamber is used as the second process chamber in each of Embodiments 3 to 5, the embodiments are not limited to the plasma etching process chambers. For example, a CVD process chamber, a plasma CVD process chamber, and a sputter deposition chamber may be used in place of the plasma etching process chamber.

As described above, according to the present invention, a surface-treating apparatus having the following characteristic features can be provided. That is, an object to be treated, e.g., a semiconductor wafer can be etched with high accuracy, and discharging of a harmful gas deposited on the object which has been etched can be suppressed, and deposition/attachment of reaction products and droplets to the surface of the object can be prevented.

According to the present invention, there is provided a surface treating method capable of etching an object to be treated, e.g., a semiconductor wafer, with high accuracy, suppressing discharging of the harmful gas deposited on the surface of the etched object in the air, and preventing the surface of the object from deposition/attachment of reaction products and droplets.

According to the present invention, there is provided a surface-treating apparatus capable of evacuating various process chambers such as an etching process chamber and a CVD process chamber to which an object to be treated, e.g., a semiconductor wafer is loaded, to a predetermined degree of vacuum within a short time, thereby increasing a throughput and surface-treating the semiconductor wafer under desired conditions.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A surface-treating apparatus comprising:
   a first process chamber for etching a loaded object to be treated with an activated etching gas;
   exhausting means for setting said first process chamber at a low pressure;
   cooling means for cooling said object loaded in said first process chamber;
   a second process chamber in which said object etched in said first process chamber is loaded;
   exhausting means for setting said second process chamber at a low pressure; and
   heating means for heating said object loaded in said second process chamber.

2. An apparatus according to claim 1, wherein said first process chamber has gas supply means for supplying an etching gas and plasma generating means, the activated etching gas is obtained such that the etching gas supplied from said gas supply means is activated by a plasma generated in said first chamber by said plasma generating means.

3. An apparatus according to claim 1, wherein said cooling means comprises a hollow table which is arranged in said first process chamber on which said object is placed, a supply pipe for supplying a coolant to a hollow portion of said table, and an exhaust pipe for exhausting the coolant supplied in said hollow portion of said mounting table.

4. An apparatus according to claim 3, wherein the coolant is liquid nitrogen.

5. An apparatus according to claim 1, wherein said heating means is an energy beam radiating lamp arranged outside said second process chamber, and an energy beam transmitting window is formed in a wall of said second process chamber in which said energy beam radiating lamp is arranged.

6. An apparatus according to claim 1, wherein said heating means is a hot plate for supporting said object loaded in said second process chamber.

7. An apparatus according to claim 1, further comprising inert gas supply means for supplying an inert gas to said second process chamber.

8. An apparatus according to claim 1, further comprising gas trapping means for trapping the gas discharged from said object in said second process chamber.

9. An apparatus according to claim 1, wherein said second process chamber is a load lock chamber for unloading said object in the atmospheric pressure.

10. An apparatus according to claim 1, wherein said second process chamber comprises a first load lock chamber connected to said first process chamber, a heating chamber having heating means for heating said object conveyed from said first load lock chamber, and a second load lock chamber for unloading said object conveyed from said first process chamber.

11. A surface-treating method comprising the steps of:
    reacting an activated etching gas activated in a low-pressure atmosphere with an object to be treated while said object is cooled so as to etch said object; and
    heating said etched object in a low-pressure atmosphere or an inert atmosphere.

12. A method according to claim 11, wherein said object is cooled at a temperature falling within a ranged of $-190°$ C. to $10°$ C.

13. A method according to claim 11, wherein the activated etching gas is obtained by activating a chlorine-based gas by a plasma.

14. A method according to claim 11, wherein said object is heated at a temperature falling within a range of $50°$ C. to $100°$ C.

15. A method according to claim 11, wherein the gas discharged from said object by the step of heating said etched object in a low-pressure atmosphere or an inert atmosphere is exhausted by supplying an inert gas.

16. A surface-treating apparatus comprising:
    a first process chamber to which an object to be treated is loaded;
    activating means for radiating an energy beam onto said object in said first process chamber;
    gas trapping means, arranged in said first process means, for trapping a gas discharged from a surface of said object upon radiation of the energy beam; and
    a second process chamber, to which said object in said first process chamber is loaded, for treating the surface of said object.

17. An apparatus according to claim 16, wherein said activating means is an energy beam radiating lamp arranged outside said first process chamber, and an energy beam transmitting window is formed in a wall portion of said first process chamber in which said energy beam radiating lamp is arranged.

18. An apparatus according to claim 16, wherein said gas trapping means is arranged in said first process chamber positioned between said object and said activating means, and said gas trapping means comprises a frame member in which a coolant is circulated and a transparent window, supported by said frame member, for transmitting an energy beam emitted from said activating means.

19. An apparatus according to claim 18, wherein said coolant is liquid nitrogen.

20. An apparatus according to claim 18, wherein a heat medium is circulated in said frame member of said gas trapping means.

21. An apparatus according to claim 16, wherein said gas trapping means is arranged in said first process chamber positioned between said object and said activating means, and said gas trapping means comprises a frame member, a transparent window which is supported by said frame member and through which an energy beam emitted from said activating means is transmitted, and a cooling gas spraying member for spraying a cooling gas to said transparent window.

22. An apparatus according to claim 21, wherein said gas trapping means comprises a heated gas spraying member for splaying a heated gas to said transparent window.

23. An apparatus according to claim 16, wherein said first process chamber is a load lock chamber to which said object is loaded in the atmospheric pressure.

24. An apparatus according to claim 16, wherein said first process chamber comprises a load lock chamber to which said object is loaded at the atmospheric pressure and a degassing chamber arranged between said load lock chamber and said second process chamber and having said activating means and said gas trapping means.

25. An apparatus according to claim 16, further comprising first and second preliminary process chambers arranged on both sides of said first process chamber having said activating means and said gas trapping means, arranged in said first preliminary process chamber having another gas trapping means therein.

26. An apparatus according to claim 25, wherein said gas trapping means is moved between said first process chamber and said second preliminary process chamber, and said another gas trapping means is moved between said first preliminary process chamber and said first process chamber.

27. An apparatus according to claim 26, wherein each of said gas trapping means comprises a frame member in which a coolant and a heat medium are circulated and a transparent window, supported by said frame member, for transmitting an energy beam emitted from said activating means in said first process chamber.

* * * * *

UNITED STATES PATENT AND TRADEMARK OFFICE
CERTIFICATE OF CORRECTION

PATENT NO. : 5,240,556
DATED : August 31, 1993
INVENTOR(S) : Yoshio Ishikawa et al.

It is certified that error appears in the above-indentified patent and that said Letters Patent is hereby corrected as shown below:

On the title page, Item [54] and Column 1, Line 1,

The title, should read: --SURFACE-TREATING APPARATUS AND SURFACE-

TREATING METHOD--

Signed and Sealed this

Fifteenth Day of March, 1994

Attest:

BRUCE LEHMAN

*Attesting Officer*  *Commissioner of Patents and Trademarks*